(12) United States Patent
Pascal et al.

(10) Patent No.: US 9,557,350 B2
(45) Date of Patent: *Jan. 31, 2017

(54) ARRANGEMENT FOR MEASURING A CURRENT WITH A CURRENT TRANSDUCER OF THE ROGOWSKI TYPE

(71) Applicant: ABB TECHNOLOGY AG, Zürich (CH)

(72) Inventors: Joris Pascal, Baden (CH); Franz Zurfluh, Brugg (CH)

(73) Assignee: ABB Schweiz AG, Zurich (CH)

( * ) Notice: Subject to any disclaimer, the term of this patent is extended or adjusted under 35 U.S.C. 154(b) by 159 days.

This patent is subject to a terminal disclaimer.

(21) Appl. No.: 14/512,809

(22) Filed: Oct. 13, 2014

(65) Prior Publication Data
US 2015/0028853 A1 Jan. 29, 2015

Related U.S. Application Data

(63) Continuation of application No. PCT/EP2013/000915, filed on Mar. 27, 2013.

(30) Foreign Application Priority Data

Apr. 20, 2012 (EP) .................................... 12002767

(51) Int. Cl.
G01R 15/18 (2006.01)
G01R 19/00 (2006.01)
G01R 35/00 (2006.01)

(52) U.S. Cl.
CPC ......... *G01R 15/181* (2013.01); *G01R 19/0092* (2013.01); *G01R 35/005* (2013.01)

(58) Field of Classification Search
None
See application file for complete search history.

(56) References Cited

U.S. PATENT DOCUMENTS 6,160,697 A * 12/2000 Edel ..................... G01R 15/185
361/143
6,522,517 B1 * 2/2003 Edel ..................... G01R 15/185
361/143

(Continued)

OTHER PUBLICATIONS

International Search Report (PCT/ISA/210) mailed on Jul. 30, 2013, by the European Patent Office as the International Searching Authority for International Application No. PCT/EP2013/001133.

(Continued)

*Primary Examiner* — Paresh Patel
(74) *Attorney, Agent, or Firm* — Taft Stettinius & Hollister LLP (57) ABSTRACT

An arrangement for measuring a current with a Rogowski type current transducer and transducer electronics. The current transducer has a primary conductor winding for carrying the rated current to be measured, and a secondary conductor winding. The secondary conductor winding adapted to induce a voltage signal $V_S'$ between a pair of second terminals. The current transducer having a third conductor winding adapted to receive a calibration current signal. The voltage signal $V_S'$ contains a coil sensitivity S and is a superposition of a rated current voltage signal and an additional calibration signal. The transducer electronics being adapted to amplify both the current voltage signal and the calibration signal in the same amplifier and divide the amplified current voltage signal by that part of the amplified calibration signal that contains the coil sensitivity and the gain.

15 Claims, 3 Drawing Sheets

(56) References Cited

U.S. PATENT DOCUMENTS

| | | | |
|---|---|---|---|
| 6,624,624 B1 | 9/2003 | Karrer et al. | |
| 6,954,060 B1 * | 10/2005 | Edel .................... | G01R 15/183 |
| | | | 324/117 R |
| 6,984,979 B1 * | 1/2006 | Edel .................... | G01R 15/185 |
| | | | 324/253 |
| 2004/0140879 A1 | 7/2004 | Schafer | |
| 2006/0176140 A1 | 8/2006 | Skendzic et al. | |
| 2008/0007249 A1 | 1/2008 | Wilkerson et al. | |

OTHER PUBLICATIONS

International Search Report (PCT/ISA/210) mailed on Jul. 2, 2013, by the European Patent Office as the International Searching Authority for International Application No. PCT/EP2013/000916.
International Search Report (PCT/ISA/210) mailed on Jul. 23, 2013, by the European Patent Office as the International Searching Authority for International Application No. PCT/EP2013/000915.
Ramboz, "Machinable Rogowski Coil, Design, and Calibration", IEEE Transactions on Instrumentation and Measurement, Apr. 1, 1996, vol. 45, No. 2, pp. 511-515.
Saroj et al., "P4-13: Development and Calibration of of Rogowski Coils for Pulsed Power Systems", IEEE Vacuum Electronics Conference (IVEC), Feb. 21, 2011, pp. 471-472.

* cited by examiner

ARRANGEMENT FOR MEASURING A CURRENT WITH A CURRENT TRANSDUCER OF THE ROGOWSKI TYPE

RELATED APPLICATION(S)

This application claims priority as a continuation application under 35 U.S.C. §120 to International Application PCT/EP2013/000915 filed on Mar. 27, 2013 designating the U.S., and which claims priority to European Application 12002767.7 filed in Europe on Apr. 20, 2012. The entire content of each prior application is hereby incorporated by reference.

FIELD

The disclosure relates to an arrangement for measuring a current, with a current transducer of the Rogowski type and a transducer electronics, wherein the current transducer has a primary conductor winding having a first number of loops for carrying the rated current to be measured, a secondary conductor winding having a pair of second terminals and a helical shape and a second number of loops, said secondary conductor winding encircling the primary conductor in a toroidal manner.

BACKGROUND INFORMATION

A current transducer of the Rogowski type incorporates a device which is commonly known as a Rogowski Coil. It is widely used as a device for measuring alternating current (AC) or high frequency current pulses. This type of coil has many advantages over other types of current sensors. Known Rogowski coils can be constructed by applying an electrically conductive wire on a non-magnetic and non-conductive carrier. The carrier can be a plastic or glass or ceramic based structure and forms a closed or almost closed loop such that a kind of helical coil wire is formed. The lead from one end of the coil can return through the center of the coil or close to center of the coil to the other end, so that both terminals can be at the same end of the coil and so that the helical coil itself does not form a closed loop.

The Rogowski coil belongs to the category of air-core coils because the carrier of the coil is non-magnetic, e.g., its magnetic susceptibility is significantly smaller than 1. The carrier can be rigid or flexible and its shape can be a ring, torus, or other.

When placed around a primary conductor carrying an electrical current, the Rogowski coil generates a voltage proportional to the derivative of the current according to Ampere's law. The voltage is also proportional to the number of turns per unit length and to the area of the turns. The area of one turn is approximately equal to the cross-sectional area of the coil carrier. Because the voltage induced in the Rogowski coil is proportional to the rate of change of the current in the primary conductor, the output of the coil can be connected to an electronic device, here called transducer electronics or Intelligent Electronic Device (IED), where the signal is integrated and further processed in order to provide an accurate signal that is proportional to the current.

The Rogowski coil has many advantages over other types of current measuring devices, the most notable being the excellent linearity due to its non-magnetic core, which is not prone to saturation effects. Thus, the Rogowski coil is highly linear even when subjected to large currents, such as those used in electric power transmission, welding, or pulsed power applications. Furthermore, because a Rogowski coil has an air core rather than a magnetic core, it has a low inductance and can respond to fast changing currents. A properly formed Rogowski coil, with equally spaced windings, is largely immune to electromagnetic interference. In comparison to known ferromagnetic core based current transducers, a Rogowski coil current transducer (RCCT) exhibits a higher dynamic range, lower weight and size, as well as lower production cost.

However, known Rogowski coil current transducers provide moderate accuracy as compared to high known ferromagnetic core based current transducers, particularly for metering applications. One reason for this is the unknown changes of sensitivity S of Rogowski coils when the environmental conditions can be changing, such as temperature, mechanical constraints, humidity, aging etc. Another reason is the unknown changes of gain in electronic amplifiers being part of the transducer electronics when the environmental conditions can be changing, such as temperature, mechanical constraints, humidity, aging etc.

Because these non-desirable changes of coil sensitivity and of amplifier gain can be currently not taken into account by the electronic signal processing in the IED, such an alteration in the sensitivity and in the gain introduces an error on the measurement. Such a limitation impedes reaching high accuracy with a combination of a Rogowski coil current transducer.

One solution to compensate for sensitivity changes of known Rogowski coil current transducers includes measuring the temperature with a temperature sensor placed closed to the Rogowski coil. The temperature is then used to compensate the sensitivity according to each Rogowski sensitivity temperature profile. During the characterization (e.g., calibration) of the coil performed at the end of production, the Rogowski coil current transducers sensitivity at ambient temperature as well as its temperature dependency can be measured. The coefficients, which give the polynomial correction to apply to the signal in the transducer electronics, can be stored in an EEPROM placed in the sensor casing. This solution allows temperature effect compensation, but specifies additional production effort, such as calibration and temperature characterization of each Rogowski coil current transducer. Furthermore, it does not allow other compensations such as of mechanical, humidity and aging effects. Indeed, the correction coefficients cannot be updated once the sensor is delivered to the customer. In fact, in order to compensate for aging, the known approach can call for a maintenance effort and an interruption of the rated current measurement on the customer plant. The known Rogowski coil current transducer should be extracted from the plant and recalibrated periodically with the same procedure as the initial calibration in the factory.

PCT/EP2011/001941 and PCT/EP2011/058291 propose readout electronic arrangements that compensate themselves (e.g., self-compensate) their own gain drift without interrupting the measurement via an online capability. However, these readout electronics do not allow for the compensation of any RCCT sensitivity variation simultaneously with the measurement of the rated current.

SUMMARY

An exemplary arrangement for measuring a current is disclosed, comprising: a Rogowski type current transducer; and transducer electronics, wherein the current transducer includes: a primary conductor winding having a first number of loops for carrying the rated current to be measured; a secondary conductor winding of a helical shape, the secondary conductor having a pair of second terminals and a second number of loops, said secondary conductor winding encircling the primary conductor in a toroidal manner; a third conductor winding having a pair of third terminals with a third number of loops, wherein the third conductor winding is adapted to receive a calibration current signal, wherein the secondary conductor winding is adapted to induce a voltage signal $V_S'$ between a pair of second terminals, said voltage signal $V_S'$ having a coil sensitivity S and being a superposition of a rated current voltage signal, in response to a derivative of the rated current, and an additional calibration signal in response to the derivative of the calibration current signal, and wherein the transducer electronics having an amplifier adapted to amplify both the current voltage signal and the calibration signal, and the transducer electronics being configured to divide the amplified current voltage signal by a part of the amplified calibration signal that contains the coil sensitivity and the gain.

An exemplary system for measuring a current is disclosed, comprising: a Rogowski type current transducer that includes: a primary conductor winding that carries the rated current to be measured; a secondary conductor winding having second terminals and encircles the primary conductor in a toroidal manner; and a third conductor winding having third terminals and is adapted to receive a calibration current signal, wherein the secondary conductor winding is adapted to induce a voltage signal $V_S'$ between the second terminals, said voltage signal $V_S'$ having a coil sensitivity S and is a superposition of a rated current voltage signal and an additional calibration signal, and wherein the rated current voltage signal is generated in response to a derivative of the rated current of the primary conductor winding, and the additional calibration signal is generated in response to the derivative of the calibration current signal of the secondary conductor winding; and transducer electronics having an amplifier adapted to amplify both the current voltage signal and the calibration signal, and the transducer electronics being configured to divide the amplified current voltage signal by a part of the amplified calibration signal that contains the coil sensitivity and the gain.

BRIEF DESCRIPTION OF THE DRAWINGS

The disclosure will be described in greater detail by description of an exemplary embodiment with reference to the accompanying drawings, wherein.

DETAILED DESCRIPTION

Exemplary embodiments of the present disclosure provide an arrangement for measuring a current with a current transducer of the Rogowski type and a transducer electronics, where the transducer electronics can compensate both the drift of the sensitivity of the Rogowski coil and the drift of the amplifier gain of the transducer electronics itself.

An exemplary arrangement for measuring a current according to the present disclosure includes (e.g., comprises) a third conductor winding having a pair of third terminals with a third number of loops, wherein the third conductor winding is adapted to receive a calibration current signal $i_{Cal}$ (t), wherein the secondary conductor winding is adapted to induce between its pair of second terminals a voltage signal $V_S'$, said voltage signal $V_S'$ containing the coil sensitivity S and being a superposition of a rated current voltage signal $V_S$, in response to the derivative of the rated current $di_R(t)/dt$, and an additional calibration signal $V_{cal}$ in response to the derivative of the calibration current signal $i_{Cal}$ (t), and the transducer electronics 13 being adapted to amplify both the current voltage signal $V_S$ and the calibration signal $V_{cal}$ in the same amplifier and to divide the amplified current voltage signal by that part of the amplified calibration signal that contains the coil sensitivity and the gain.

According to an exemplary embodiment of the present disclosure, the transducer electronics 13 (IED) is adapted to feed a calibration current signal $i_{Cal}$ (t) into the third conductor winding 10.

Figure 3:
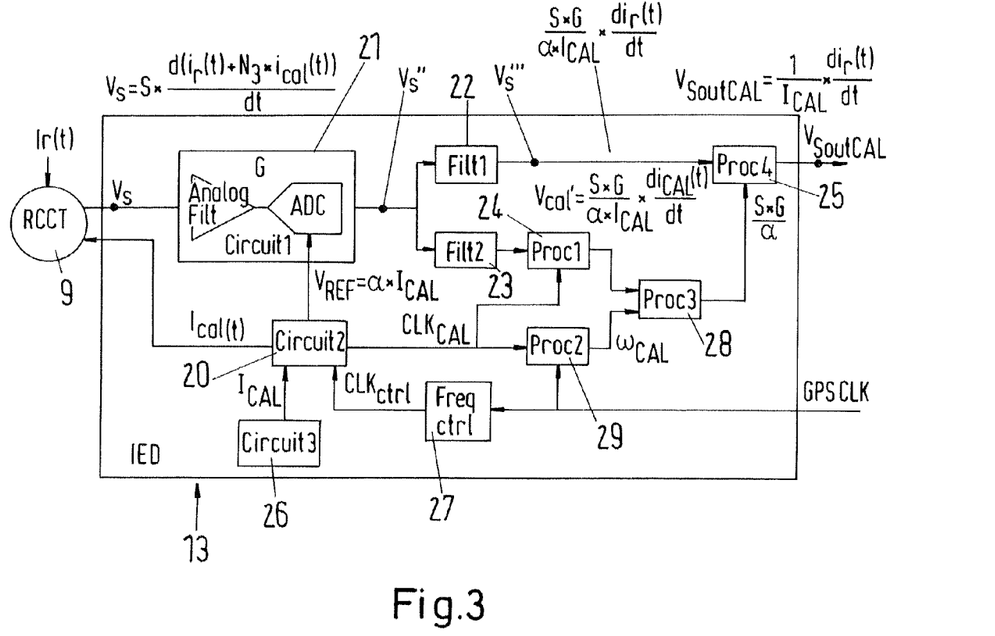
FIG. 3 shows a schematic block functional diagram of the transducer electronics according to an exemplary embodiment of the present disclosure.

According to another exemplary embodiment of the present disclosure, the transducer electronics has reference means 20 adapted to generate the calibration current signal $i_{Cal}$ (t) from a DC reference current $I_{CAL}$, a reference voltage $V_{REF}$, being proportional to the DC reference current $I_{CAL}$, a frequency output $CLK_{cal}$ for characterizing the actual frequency ($\omega_{CAL}$) of the calibration current signal $i_{Cal}$ (t), first amplification means 21, adapted to multiply the voltage signal $V_S'$ with an amplifier gain G and dividing it by the reference voltage $V_{REF}$, to generate an amplified signal $V_S''$, first filtering means, adapted to filter out the calibration signal $V_{cal}$ from the amplified signal $V_S''$ and to generate an amplified current signal $V_S'''$, second filtering 23 and processing means 24 adapted to generate an amplified calibration signal $V_{cal}'$, fourth processing means 25 adapted to divide the amplified current signal $V_S'''$ by the quotient resulting from the amplitude of the amplified calibration signal $V_{cal}'$ and the frequency $\omega_{CAL}$ of the calibration current signal $i_{Cal}(t)$, to derive a corrected signal $V_{Sout,cal}$ having cancelled out the effects of drift of sensitivity of the Rogowski coil and drift of the gain of the first and the second circuit.

According to another exemplary embodiment of the present disclosure, there is a current reference source in the transducer electronics, which is adapted to generate the amplitude $I_{CAL}$ of the current $i_{CAL}(t)$.

According to another exemplary embodiment of the present disclosure, the transducer electronics includes control signal generation means adapted to generate a control signal $CLK_{ctrl}$ to set the frequency $f_{CAL}$ of $i_{CAL}(t)$.

According to another exemplary embodiment of the present disclosure, the transducer electronics includes frequency measuring means adapted to measure the effective frequency of the calibration current $i_{CAL}(t)$ using a reference clock.

According to another exemplary embodiment of the present disclosure, the reference clock is an Global Positioning system (GPS) clock.

According to yet another exemplary embodiment of the present disclosure, the reference clock is an internal oscillator in the transducer electronics.

According to an exemplary embodiment of the present disclosure, the transducer electronics includes processing means which can be adapted to make a frequency detection to extract the calibration current $i_{CAL}(t)$ from its input.

According to another exemplary embodiment of the present disclosure, the transducer electronics includes amplitude division means which can be adapted to compute the amplitude of the output of the processing means and divide it by the frequency $\omega_{CAL}$ of the calibration current $i_{CAL}(t)$.

An exemplary current transducer with a third, additional winding according to the disclosure provides an easy way of calibrating the sensitivity of the Rogowski coil, by just feeding a calibration current into the third winding. No additional, second measurement technique, like the temperature measurement according to the state of the art, is specified. The response of the Rogowski coil to the calibration current in the third winding, measured as additional voltage signal at the terminals of the second winding, is fully compatible from a physical and measuring point of view to the response of the Rogowski coil to the rated current $i_r(t)$ to be measured in the first winding. The response to the calibration current through the third winding will be exposed to the same or nearly identical drifting and aging influences as the response to the rated current through the first winding. This turns the way of calibration much more accurate and direct, as compared to the somewhat indirect calibration method by using an extra indication parameter like the temperature.

The third winding in the Rogowski coil transducer according to the disclosure offers the possibility to calibrate the Rogowski coil sensitivity off-line as well as on-line, depending on the way the transducer electronics are designed and the way the calibration procedure is performed. By using the third winding, the sensitivity of the Rogowski coil can be measured and calibrated when the rated current measurement is not running, e.g., off-line in the factory at the end of production, or at an installed transducer during an in-field maintenance operation.

The third, additional winding also provides a manner of continuously measuring within the transducer electronics, the sensitivity of the Rogowski coil current transducer without interrupting the rated current $I_r$ measurement. One advantage of the exemplary embodiments disclosed herein modify a known Rogowski coil design so that it provides the IED (Intelligent Electronic Device) with the capability to continuously calibrate the Rogowski coil current transducers sensitivity online, e.g., without interrupting the rated current measurement.

The design of the transducer electronics in connection with the RCCT design with the third winding according to the disclosure ensures that both the current voltage signal and the calibration signal contain the coil sensitivity and can be amplified with the same gain of the first amplification means. The result is that both the current voltage signal and the calibration signal can be subject to the same drift effects of the gain of the first amplification means and subject to the same drift effects of the coil sensitivity. By dividing basically the amplified current voltage signal by that part of the amplified calibration signal that contains the coil sensitivity and the gain in the fourth processing means according to the disclosure, the gain of the first amplification means and the coil sensitivity can be eliminated and can be the drift effects of the gain of the first amplification means and the drift effects of the coil sensitivity.

By combining a Rogowski coil current transducer (RCCT) with a third winding and the transducer electronics design according to an exemplary embodiment disclosed herein, the transducer electronics can correct the RCCT sensitivity S as well as its own gain G by injecting a calibration current $i_{CAL}(t)$ through the RCCT. The drift of RCCT sensitivity and drift of the transducer electronics gain can be compensated in the output signal. Consequently, the output voltage signal depends only on the amplitude $I_{CAL}$ of the current $i_{CAL}(t)$, which is generated in the transducer electronics by a stable and accurate current source. The output voltage signal depends only on the calibration current $I_{CAL}$. All the drifts due to electronic components, like drifts of gain G, as well as the RCCT sensitivity drifts, drifts on S, can be compensated in the output voltage signal.

Figure 1:
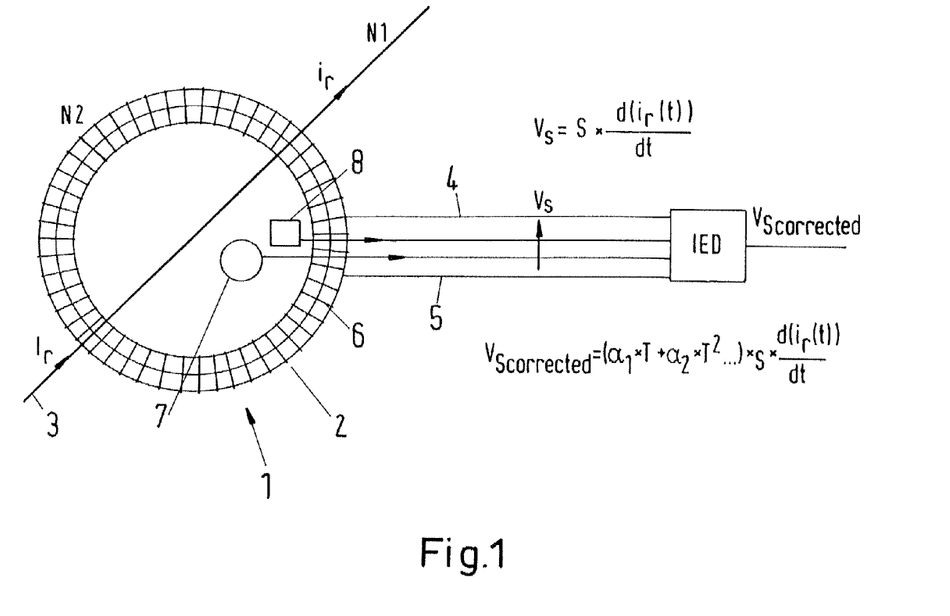
FIG. 1 shows an exemplary Rogowski coil current transducer according to a known implementation.

FIG. 1 shows an exemplary Rogowski coil current transducer according to a known implementation. As shown in FIG. 1, where the calibration coefficients of the Rogowski coil current transducer 1 can be obtained by characterizing the sensors in the factory. The primary conductor 3 carrying the rated current $i_R(t)$ to be measured is passing through the center of a known Rogowski coil 2. Between the pair of secondary terminals 4, 5 of the secondary conductor winding 6 there is a rated current induced voltage signal $V_S$, which can be determined as $V_S=S\times d(i_R(t))/dt$, where S is the sensitivity of the Rogowski coil.

A temperature sensor 7 measuring the temperature is placed close (e.g. close proximity) to the Rogowski coil 2. The rated current voltage signal $V_S$ and the temperature measurement is fed into the transducer electronics IED. In the IED, the temperature measurement is used to compensate the sensitivity S according to each Rogowski sensitivity temperature profile. The coefficients, which give the polynomial correction to apply to the signal in the transducer electronics, can be stored in an EEPROM 8 placed in the sensor casing. The corrected sensitivity $S_{corrected}$ includes a product multiplying the original coil sensitivity S and a correction polynom ($\alpha_1\times T+\alpha_2\times T^2+\ldots$). The corrected rated current voltage signal $V_{Scorrected}$ is then calculated to be $$V_{Scorrected}=S_{corrected}\times d(i_R(t))/dt=(\alpha_1\times T+\alpha_2\times T^2+\ldots)\times S\times d(i_R(t))/dt.$$

The characterization (e.g., calibration) of the coil can be performed at the end of production of the coil. During this calibration, the Rogowski coil current transducers sensitivity at ambient temperature as well as its temperature dependency can be measured. This solution allows temperature effect as well as initial error compensation, initial errors for example due to ambient temperature, but specifies additional production effort, such as calibration and temperature characterization of each Rogowski coil current transducer.

So the temperature sensor 7 and the EEPROM 8 containing the coefficients allow online temperature compensation, but no ageing, humidity or mechanical effect can be taken into account because the coefficients cannot be dynamically updated.

Figure 2:
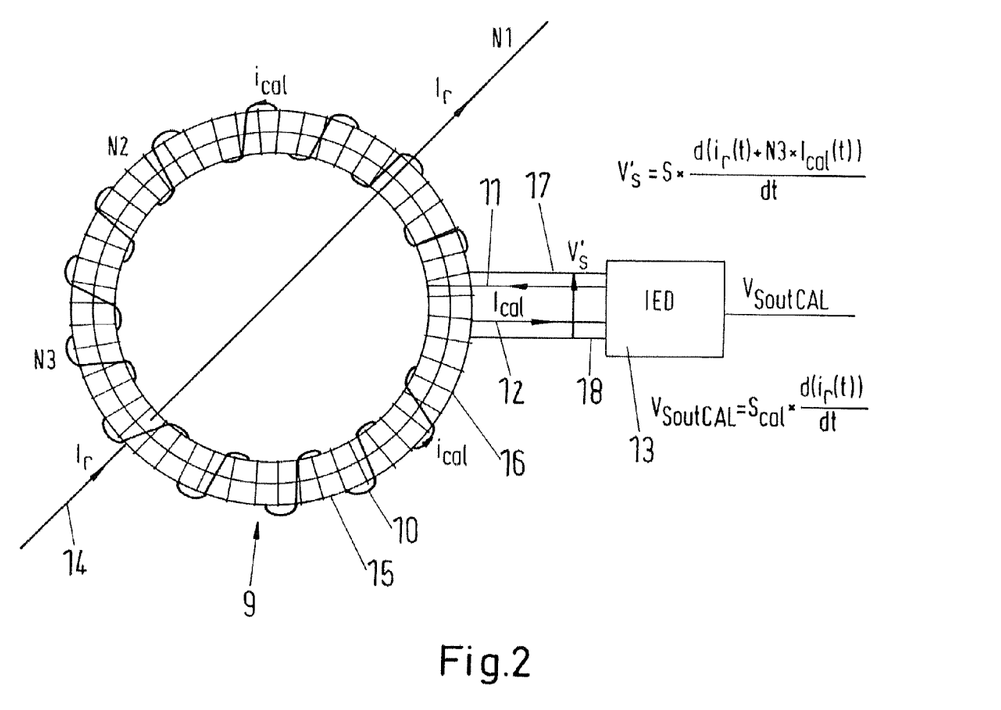
FIG. 2 shows an exemplary Rogowski coil current transducer design according to an exemplary embodiment of the present disclosure.

FIG. 2 shows an exemplary Rogowski coil current transducer design according to an exemplary embodiment of the present disclosure. As shown in FIG. 2, a Rogowski coil 10 includes a primary conductor 14 that carries the rated current $i_R(t)$ to be measured and is passing through the center of the known Rogowski coil 15 with the secondary conductor winding 16.

The Rogowski coil current transducer 9 includes a third conductor winding 10 having a pair of third terminals 11, 12 with a third number of loops (N3).

The transducer electronics (IED) 13 is configured to feed a calibration current signal $i_{Cal}(t)$ into the third conductor winding 10. In response to the derivative of the calibration current signal ($di_{Cal}(t)/dt$) through the third conductor winding 10, an additional calibration signal ($V_{cal}$) is created between the pair of second terminals 17, 18 of the second winding 16: $V_{cal}=N3\times dI_{cal}/d_t$.

The rated current voltage signal $V_S'$ between the pair of secondary terminals 17, 18 of the secondary conductor winding 16, which is fed into the transducer electronics, can be determined to be $V_S'=V_S+V_{cal}=S\times(d(i_r(t)+N3\times i_{Cal}(t))/dt)$, with S being the sensitivity of the Rogowski coil. $V_S'$ can be understood to be a superposition of the rated current voltage signal $V_S=S\times d(i_r(t)/dt)$ and the calibration voltage signal $V_{cal}=S\times N3\times dI_{cal}d_t$.

The transducer electronics 13 (IED) is configured to process the rated current voltage signal $V_S'$ and the calibration signal $V_{cal}$ to derive a calibrated voltage signal $$V_{SoutCAL}=S_{cal}\times d(i_R(t))/dt, \text{ with a calibrated sensitivity } S_{cal}.$$

So an additional winding N3 is designed for the RCCT, which is fed by a calibration current. The frequency of the calibration current is outside the frequency range of the rated current $i_R(t)$ to be measured. This additional winding offers the possibility to continuously measure within the transducer electronics 13 (IED) the corrected RCCT sensitivity $S_{cal}$ without interrupting the rated current $i_R(t)$ measurement.

An accurate calibration signal $i_{Cal}(t)$ is injected through the additional winding N3. Knowing precisely the number of loops N3 and the current $i_{cal}(t)$, e.g., its amplitude and frequency, one can separate $i_r(t)$ and $i_{cal}(t)$ within the secondary voltage and detect any changes of the RCCT sensitivity. In this manner a way is provided to calibrate the sensitivity $S_{cal}$ without interrupting the measurement of the rated current $i_R(t)$.

$i_{cal}(t)$ can be much smaller than $i_R(t)$ in amplitude, as smaller currents can be generated in the electronics more easily, and can have a higher frequency. For example for a value of $I_r=100$ A (amplitude of $i_R(t)$) and $f_r=50$ Hz, one can choose the combination $f_{cal}>5$ kHz, $I_{cal}=10$ mA (amplitude of $i_{cal}(t)$), N3=100 loops. In this manner one can have: $d(i_R(t))/dt=N3\cdot di(t)/dt$, so the signal of the calibration current creates about the same signal amplitude as the rated current. This is advantageous for achieving best resolution and accuracy in the calibration. $f_{cal}$ shall be selected outside the specified bandwidth of the primary current in the typical applications, e.g., higher than the highest harmonic to be measured.

So if one needs to limit the amplitude $I_{cal}$ of the current $i_{cal}(t)$ to much less than the amplitude $I_R$ of the rated current $i_R(t)$, which can be required because $i_{cal}(t)$ has to be generated in the transducer electronics IED, $i_{cal}(t)$ can be applied at a frequency 10 to 100 times higher than the rated current signal. Because one can assume a very linear behavior of the Rogowski coil current transducer (RCCT) in its frequency domain, which is can be in a range between 10 Hz and 10 kHz, this frequency discrepancy between $i_R(t)$ and $i_{cal}(t)$ does not affect significantly the sensitivity estimation, which will be then calculated at a frequency 10 to 100 times higher than the rated current frequency. It is even possible to reach higher frequency, e.g., smaller current amplitude, while staying in the linear regime.

In many cases there is an electric shield around the Rogowski coil in order to protect it from electric crosstalk from the primary conductor or from other sources. In this case it is advantageous to put the calibration windings between the shield and the winding N2 in order to protect it from external influences, thus making it easier to perform a clean calibration.

In the case of a very high homogeneity of the winding N2, N3 can be a short cylindrical winding covering just a part of N2.

However, in order to accurately take into account the possible localized non-homogeneity of the winding N2 for the RCCT sensitivity calculation, it is advantageous that the winding N3 covers the full perimeter of the coil. A reasonable number of loops ratio can be chosen between N2/N3=10 and N2/N3=100. This number of loops contributes also to limit the necessary current amplitude $I_{cal}(t)$. So the number of loops N3 can be smaller than the secondary winding number of loops N2, but N3 should cover the entire RCCT perimeter in order to reduce the effect of winding inhomogeneities. The ratio N2/N3 depends on the expected N2 winding homogeneity. The more homogenous the winding N2 is, the higher N2/N3 (the lower N3) can be.

The winding N3 could be placed between the winding N2 and the shield, thus protecting it from external perturbations.

The signals of the calibration current and the current to be measured can be separated in the transducer electronics IED based on frequency separating filters. The signal generated by the calibration current is removed from the output signal of the Rogowski coil sensor. The signal induced by the calibration current is thus used to correct the amplitude of the output signal of the Rogowski coil sensor.

Several calibration frequencies can be sequentially used in order to obtain more accurate calibration coefficients. Alternatively, subsequent calibration coefficients can be averaged in order to improve the accuracy.

The calibrated sensitivity $S_{cal}$ can be calculated continuously, or on a scheduled-basis, in the transducer electronics IED and applied to the rated signal $i_R(t)$ ensuring highest accuracy on the rated current measurement over changing conditions, such as aging, temperature, mechanical strain or humidity. If the calibration current is precisely controlled, dimensional changes of the calibration winding due to these influences will not deteriorate the accuracy of the calibration process.

The rated current $i_R(t)$ measurement can be made (e.g., configured, connected) to be never interrupted. It is not influenced by the continuously injected calibration current $i_{cal}(t)$. This principle is called continuous online calibration.

In order to avoid damping and phase shift of the sensor signal, suited measures should be taken to prevent the primary current from inducing currents in the calibration winding. This can be done by inserting an additional effective impedance into the path of the calibration current. This can be achieved with a high pass filter or with an active control of the calibration current, which turns it into an ideal current source.

It should be understood that the calibration procedure as described above in the context of FIG. 2 can be applied on-line or off-line. In case of an off-line calibration the transducer electronics 13 would be connected to the Rogowski coil transducer 9 in an off-line mode, for example in the factory at the end of production, or in the field during an in-field sensor maintenance operation.

FIG. 3 shows a schematic block functional diagram of the transducer electronics according to an exemplary embodiment of the present disclosure. As shown in FIG. 3, the transducer electronics 13, also called IED, receives as an input the rated current voltage signal $V_S'$ and an external reference clock GPSCLK, transmitted by GPS. The reference clock could also be generated by an embedded reference oscillator. In this embodiment, the GPSCLK input would be redundant and not necessary.

The IED 13 produces as output signals the calibration current $i_{cal}(t)$ to be fed into the third winding 10, and the calibrated voltage signal $V_{SouCAL}$. The calibrated voltage signal $V_{SouCAL}$ contains the derivative of the rated current $di_r(t)/dt$ and the DC reference current $I_{cal}$. Gain G of the amplifier and sensitivity S of the Rogowski coil have been eliminated due to the internal signal processing in the IED, so all the drifts due to electronic components, drifts on gain G, as well as the RCCT sensitivity drifts, drifts on S, can be compensated in the calibrated voltage signal $V_{SoutCAL}$.

The transducer electronics IED can have reference means 20 which can be adapted to generate the calibration current signal $i_{Cal}$ (t) from a DC reference current $I_{CAL}$. Further there is a reference voltage $V_{REF}$, which is proportional to the DC reference current $I_{CAL}$, there is further on a frequency output $CLK_{cal}$ for characterizing the actual frequency $f_{CAL}$ of the calibration current signal $i_{Cal}$ (t). There can be first amplification means 21, adapted to multiply the voltage signal $V_S'$ with an amplifier gain G and dividing it by the reference voltage $V_{REF}$, to generate a signal $V_S''$, first filtering means 22 can be adapted to filter out the calibration signal $V_{cal}$ from the signal $V_S''$ and to generate a current signal $V_S'''$. Further, second filtering 23 and processing means 24 can be adapted to generate a calibration signal $V_{cal}'$. Fourth processing means 25 can be adapted to divide the current signal $V_S'''$ by the quotient resulting from the amplitude of the calibration signal $V_{cal}'$ and the frequency $f_{CAL}$ of the calibration signal $i_{Cal}$ (t), to derive the corrected signal $V_{Sout,cal}$ having cancelled out the effects of drift of sensitivity of the Rogowski coil and drift of the gain of the first amplification circuit.

The functional blocks inside the IED 13 can be described in more detail.

The first amplification means 21 receive the current voltage signal $V_S'$ and perform filtering, amplification and analog to digital conversion, comparing the input voltage $V_S'$ to a reference voltage $V_{REF}$.

The reference circuit means 20 generate an AC reference current $i_{CAL}(t)$ from a DC reference current $I_{CAL}$. The current $i_{CAL}(t)$ is injected in the additional, third winding 10 of the RCCT as described above. Reference circuit means 20 also generates from $I_{CAL}$ the DC reference voltage $V_{REF}$. The frequency of $i_{CAL}(t)$ is generated from an external reference clock transmitted by GPS, or can alternatively be generated by an embedded reference oscillator. Reference circuit means 20 finally generates also an output $CLK_{CAL}$ which gives the actual frequency of $i_{CAL}(t)$.

The current reference source 26 is an accurate stable current reference source to produce the DC reference current $I_{CAL}$.

Control signal generation means 27 generates the control signal $CLK_{ctrl}$ to set the frequency $f_{CAL}$ of $i_{CAl}(t)$. $f_{CAL}$ is set higher than the rated frequency and is chosen different from the rated signal frequency harmonics. $f_{CAL}$ can be dynamically changed in order to detect in the amplitude division means 28, to be described below, possible superimposition of the reference $i_{CAL}(t)$ with polluting signals occurring in the primary rated signal $i_r(t)$ or with external perturbations.

Frequency measuring means 29 measures the effective frequency of $i_{CAL}(t)$ using a reference clock, i.e. GPS clock or internal oscillator.

First filtering means 22 and second filtering means 23 can be two (2) digital decimation filters delivering two (2) different data rates. The output of first filtering means 22 contains the rated signal $i_r(t)$ and filters out the calibration signal $i_{CAL}(t)$. The output of second filtering means 23 is at higher frequency and contains both signals $i_r(t)$ and $i_{CAL}(t)$.

Processing means 24 makes a frequency detection to extract $i_{CAL}(t)$ from its input.

Amplitude division means 28 computes the amplitude of the output of the processing means 24 and divides it by the frequency of $i_{CAL}(t)$, e.g., $\omega_{CAL}$. The output of the processing means 24 is a purely sinusoidal signal which makes it possible to compute its amplitude through a simple rms calculation.

Fourth processing means 25 cancels the effects of sensitivity S and gain G by dividing the output of the first filtering means 22 by the output of the amplitude division means 28.

The IED output $V_{SoutCAL}$ thus depends only on the DC accurate and stable current $I_{CAL}$ generated in the current reference source 26. This results in the following:

$$V_{SoutCAL} = 1/I_{CAL} \times d(i_R(t))/dt$$

All the amplitude drifts due to electronic components drifts in the IED or due to sensitivity variation of RCCT have been cancelled in the output signal $V_{SoutCAL}$.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SIGNS

1 Rogowski coil current transducer
2 Rogowski coil
3 primary conductor
4 secondary terminal
5 secondary terminal
6 secondary winding
7 temperature sensor
8 EEPROM
9 Rogowski coil current transducer
10 third winding
11 third terminal
12 third terminal
13 transducer electronics
14 primary conductor
15 Rogowski coil
16 secondary winding
17 secondary terminal
18 secondary terminal
20 reference circuit means
21 first amplification means
22 first filtering means
23 second filtering means
24 processing means
25 fault processing means
26 current reference source
27 control signal generating means
28 amplitude division means
29 frequency measuring means

What is claimed is:
1. An arrangement for measuring a current, comprising:
a Rogowski type current transducer; and
transducer electronics,
wherein the current transducer includes:
a primary conductor winding having a first number of loops for carrying the rated current to be measured;
a secondary conductor winding of a helical shape, the secondary conductor having a pair of second terminals and a second number of loops, said secondary conductor winding encircling the primary conductor in a toroidal manner;
a third conductor winding having a pair of third terminals with a third number of loops, wherein the third conductor winding is adapted to receive a calibration current signal, wherein the secondary conductor winding is adapted to induce a voltage signal $V_S'$ between the pair of second terminals, said voltage signal $V_S'$ including a coil sensitivity S and being a superposition of a rated current voltage signal and an additional calibration signal, the rated current voltage being generated in response to a derivative of the rated current, and the additional calibration signal being generated in response to the derivative of the calibration current signal, and wherein the transducer electronics having an amplifier adapted to amplify both the current voltage signal and the calibration signal, and the transducer electronics being configured to divide the amplified current voltage signal by a part of the amplified calibration signal that contains the coil sensitivity and the gain.

2. The arrangement according to claim 1, wherein the transducer electronics is adapted to feed a calibration current signal into the third conductor winding.

3. The arrangement according to claim 1, wherein the transducer electronics includes:
reference means adapted to generate the calibration current signal from a DC reference current $I_{CAL}$;
a reference voltage $V_{REF}$ that is proportional to the DC reference current $I_{CAL}$;
a frequency output $CLK_{cal}$ for characterizing a frequency of calibration current signal first amplification means, the calibration current signal first amplification means is adapted for multiplying the voltage signal $V_S'$ with a gain and dividing it by the reference voltage $V_{REF}$ to generate a signal $V_S''$;
first filtering means adapted to filter out the calibration signal from the signal $V_S''$ and generate a current signal;
second filtering and processing means configured to include an amplified calibration signal fourth processing means adapted to divide the amplified current signal by a quotient resulting from an amplitude of the amplified calibration signal and an actual frequency of the calibration current signal to derive a corrected voltage signal by cancelling out effects of drift of sensitivity of the Rogowski coil and drift of the gain of the calibration current signal first amplification means.

4. The arrangement according to claim 3, wherein the transducer electronics includes:
a current reference source in the transducer electronics, which is adapted to generate the amplitude $I_{CAL}$ of the current $i_{CAL}(t)$.

5. The arrangement according to claim 4, comprising:
control signal generation means adapted to generate a control signal $CLK_{ctrl}$ to set a frequency $f_{CAL}$ of $i_{CAL}(t)$.

6. The arrangement according to claim 5, comprising:
frequency measuring means adapted to measure an effective frequency of the calibration current $i_{CAL}(t)$ using a reference clock.

7. The arrangement according to claim 6, wherein the reference clock is an Global Positioning System clock.

8. The arrangement according to claim 6, wherein the reference clock is an internal oscillator in the transducer electronics.

9. The arrangement according to claim 6, further wherein processing means which are adapted for frequency detection to extract the calibration current $i_{CAL}(t)$ from its input.

10. The arrangement according to claim 9, comprising:
amplitude division means which are adapted to compute the amplitude of the output of the processing means and divide it by the actual frequency $\omega_{CAL}$ of the calibration current $i_{CAL}(t)$.

11. A system for measuring a current, comprising:
a Rogowski type current transducer that includes:
a primary conductor winding that carries the rated current to be measured;
a secondary conductor winding having second terminals and encircles the primary conductor in a toroidal manner; and
a third conductor winding having third terminals and is adapted to receive a calibration current signal,
wherein the secondary conductor winding is adapted to induce a voltage signal $V_S'$ between the second terminals, said voltage signal $V_S'$ having a coil sensitivity S and is a superposition of a rated current voltage signal and an additional calibration signal, and
wherein the rated current voltage signal is generated in response to a derivative of the rated current of the primary conductor winding, and the additional calibration signal is generated in response to the derivative of the calibration current signal of the secondary conductor winding; and
transducer electronics having an amplifier adapted to amplify both the current voltage signal and the calibration signal, and the transducer electronics being configured to divide the amplified current voltage signal by a part of the amplified calibration signal that contains the coil sensitivity and the gain.

12. The system according to claim 11, wherein the primary conductor winding has a first number of loops.

13. The system according to claim 11, wherein the secondary conductor winding has a helical shape and a second number of loops.

14. The system according to claim 11, wherein the transducer electronics is adapted to feed a calibration current signal into the third conductor winding.

15. The system according to claim 11, wherein the transducer electronics includes:
reference means adapted to generate the calibration current signal from a DC reference current $I_{CAL}$;
a reference voltage $V_{REF}$ that is proportional to the DC reference current $I_{CAL}$;
a frequency output $CLK_{cal}$ for characterizing a frequency of calibration current signal first amplification means, the calibration current signal first amplification means is adapted for multiplying the voltage signal $V_S'$ with a gain and dividing it by the reference voltage $V_{REF}$ to generate a signal $V_S''$;
first filtering means adapted to filter out the calibration signal from the signal $V_S''$ and generate a current signal; and
second filtering and processing means adapted to generate an amplified calibration signal fourth processing means adapted to divide the amplified current signal by the quotient resulting from the amplitude of the amplified calibration signal and the frequency of the calibration current signal to derive a corrected voltage signal by cancelling out effects of drift of sensitivity of the Rogowski coil and drift of the gain of the first amplification circuit.

* * * * *